(12) United States Patent
Chesnutt et al.

(10) Patent No.: US 8,259,840 B2
(45) Date of Patent: Sep. 4, 2012

(54) DATA COMMUNICATION VIA A VOICE CHANNEL OF A WIRELESS COMMUNICATION NETWORK USING DISCONTINUITIES

(75) Inventors: Elizabeth Chesnutt, Troy, MI (US); Jijun Yin, Los Angeles, CA (US); Sethu K. Madhavan, Canton, MI (US); Iqbal M. Surti, Troy, MI (US)

(73) Assignee: General Motors LLC, Detroit, MI (US)

( * ) Notice: Subject to any disclaimer, the term of this patent is extended or adjusted under 35 U.S.C. 154(b) by 1194 days.

(21) Appl. No.: 11/967,396

(22) Filed: Dec. 31, 2007

(65) Prior Publication Data

US 2008/0255828 A1   Oct. 16, 2008

Related U.S. Application Data

(63) Continuation-in-part of application No. 11/554,985, filed on Oct. 31, 2006, which is a continuation-in-part of application No. 11/163,579, filed on Oct. 24, 2005.

(51) Int. Cl.
*H04L 27/20* (2006.01)
(52) U.S. Cl. ........................................ 375/295; 375/308
(58) Field of Classification Search .................. 375/259, 375/219, 222, 268, 269, 271, 272, 273, 279, 375/283, 295, 302, 303, 308, 280, 281, 282; 379/93.01; 332/103
See application file for complete search history.

(56) References Cited

U.S. PATENT DOCUMENTS

| | | | |
|---|---|---|---|
| 3,731,201 | A | 5/1973 | Frisbie |
| 4,499,339 | A | 2/1985 | Richard |
| 4,601,045 | A | 7/1986 | Lubarsky |
| 4,675,614 | A | 6/1987 | Gehrke |
| 4,928,107 | A | 5/1990 | Kuroda et al. |
| 5,043,736 | A | 8/1991 | Darnell et al. |

(Continued)

FOREIGN PATENT DOCUMENTS

EP   0545783   6/1993

(Continued)

OTHER PUBLICATIONS

Office Action for U.S. Appl. No. 11/554,985, issued Dec. 22, 2010 (8 pages).

(Continued)

*Primary Examiner* — Tesfaldet Bocure
(74) *Attorney, Agent, or Firm* — Anthony L. Simon; Reising Ethington P.C.

(57) ABSTRACT

A system and method for data communication over a cellular communications network that allows the transmission of digital data over a voice channel using a vocoder that operates in different modes depending upon characteristics of the inputted signal it receives. To prepare the digital data for transmission, one or more carrier signals are encoded with the digital data using one of a number of modulation schemes that utilize differential phase shift keying to give the modulated carrier signal certain periodicity and energy characteristics that allow it to be transmitted by the vocoder at full rate. The modulation schemes include DPSK using either a single or multiple frequency carriers, combined FSK-DPSK modulation, combined ASK-DPSK, PSK with a phase tracker in the demodulator, as well as continuous signal modulation (ASK or FSK) with inserted discontinuities that can be independent of the digital data.

11 Claims, 13 Drawing Sheets

U.S. PATENT DOCUMENTS

| | | | |
|---|---|---|---|
| 5,223,844 | A | 6/1993 | Mansell et al. |
| 5,235,633 | A | 8/1993 | Dennison et al. |
| 5,365,450 | A | 11/1994 | Schuchman et al. |
| 5,388,147 | A | 2/1995 | Grimes |
| 5,422,816 | A | 6/1995 | Sprague et al. |
| 5,539,810 | A | 7/1996 | Kennedy, III et al. |
| 5,555,286 | A | 9/1996 | Tendler |
| 5,712,899 | A | 1/1998 | Pace, II |
| 5,754,554 | A | 5/1998 | Nakahara |
| 5,786,789 | A | 7/1998 | Janky |
| 5,812,087 | A | 9/1998 | Krasner |
| 5,946,304 | A | 8/1999 | Chapman |
| 5,978,756 | A | 11/1999 | Walker |
| 5,987,068 | A | 11/1999 | Cassia et al. |
| 5,999,125 | A | 12/1999 | Kurby |
| 6,011,806 | A | 1/2000 | Herring |
| 6,049,303 | A | 4/2000 | Biacs et al. |
| 6,070,089 | A | 5/2000 | Brophy et al. |
| 6,091,969 | A | 7/2000 | Brophy et al. |
| 6,108,317 | A | 8/2000 | Jones et al. |
| 6,140,956 | A | 10/2000 | Hillman |
| 6,144,336 | A | 11/2000 | Preston et al. |
| 6,175,801 | B1 | 1/2001 | Millington |
| 6,226,529 | B1 | 5/2001 | Bruno et al. |
| 6,236,652 | B1 | 5/2001 | Preston et al. |
| 6,307,864 | B1 | 10/2001 | Fensch et al. |
| 6,345,251 | B1 | 2/2002 | Jansson et al. |
| 6,363,339 | B1 | 3/2002 | Rabipour et al. |
| 6,366,772 | B1 | 4/2002 | Arnson |
| 6,445,745 | B1 | 9/2002 | Bontu et al. |
| 6,456,964 | B2 * | 9/2002 | Manjunath et al. ........... 704/205 |
| 6,493,338 | B1 | 12/2002 | Preston et al. |
| 6,584,438 | B1 * | 6/2003 | Manjunath et al. ........... 704/228 |
| 6,611,804 | B1 | 8/2003 | Dorbecker et al. |
| 6,614,349 | B1 | 9/2003 | Proctor et al. |
| 6,665,283 | B2 | 12/2003 | Harris et al. |
| 6,681,121 | B1 | 1/2004 | Preston et al. |
| 6,690,681 | B1 | 2/2004 | Preston et al. |
| 6,748,026 | B1 | 6/2004 | Murakami et al. |
| 6,754,265 | B1 | 6/2004 | Lindemann |
| 6,771,629 | B1 | 8/2004 | Preston et al. |
| 6,920,129 | B2 | 7/2005 | Preston et al. |
| 7,151,768 | B2 | 12/2006 | Preston et al. |
| 7,164,662 | B2 | 1/2007 | Preston et al. |
| 7,173,995 | B2 | 2/2007 | Karlquist |
| 7,206,305 | B2 | 4/2007 | Preston et al. |
| 7,239,859 | B2 | 7/2007 | Madhavan et al. |
| 2001/0019592 | A1 | 9/2001 | Solondz |
| 2001/0036174 | A1 | 11/2001 | Herring |
| 2002/0001317 | A1 | 1/2002 | Herring |
| 2002/0097701 | A1 | 7/2002 | Lupien et al. |
| 2002/0111172 | A1 | 8/2002 | DeWolf et al. |
| 2002/0175855 | A1 | 11/2002 | Richton et al. |
| 2002/0177450 | A1 | 11/2002 | Vayanos |
| 2003/0069694 | A1 | 4/2003 | Fuchs |
| 2003/0142646 | A1 | 7/2003 | Paneth et al. |
| 2003/0144836 | A1 | 7/2003 | Kurtz |
| 2003/0225574 | A1 | 12/2003 | Matsuura et al. |
| 2004/0008618 | A1 | 1/2004 | Shirakata et al. |
| 2004/0102969 | A1 * | 5/2004 | Manjunath et al. ........... 704/229 |
| 2004/0198378 | A1 | 10/2004 | Hay |
| 2004/0214599 | A1 | 10/2004 | Ogino |
| 2004/0220803 | A1 | 11/2004 | Chiu et al. |
| 2005/0013283 | A1 | 1/2005 | Yoon et al. |
| 2005/0021332 | A1 | 1/2005 | Ryu et al. |
| 2005/0113061 | A1 | 5/2005 | Madhavan et al. |
| 2005/0125152 | A1 | 6/2005 | Fuchs et al. |
| 2005/0143916 | A1 | 6/2005 | Kim et al. |
| 2005/0175113 | A1 | 8/2005 | Okuyama |
| 2005/0182530 | A1 | 8/2005 | Murphy |
| 2006/0206334 | A1 * | 9/2006 | Kapoor et al. ................ 704/267 |
| 2006/0224317 | A1 | 10/2006 | Sarkar |
| 2006/0239363 | A1 | 10/2006 | Blakeney et al. |
| 2006/0262875 | A1 | 11/2006 | Madhavan |
| 2006/0280159 | A1 | 12/2006 | Bi et al. |
| 2007/0092024 | A1 | 4/2007 | Madhavan et al. |
| 2007/0109185 | A1 | 5/2007 | Kracke et al. |
| 2007/0129077 | A1 | 6/2007 | Iguchi et al. |
| 2007/0135134 | A1 | 6/2007 | Patrick |
| 2007/0190950 | A1 | 8/2007 | Madhavan et al. |
| 2007/0244695 | A1 | 10/2007 | Manjunath et al. |
| 2007/0258398 | A1 | 11/2007 | Chesnutt et al. |
| 2008/0247484 | A1 | 10/2008 | Chesnutt et al. |
| 2008/0273644 | A1 | 11/2008 | Chesnutt et al. |
| 2009/0319263 | A1 * | 12/2009 | Gupta et al. .................. 704/229 |

FOREIGN PATENT DOCUMENTS

| | | |
|---|---|---|
| WO | WO8912835 | 12/1989 |

OTHER PUBLICATIONS

Letter of May 15, 2007, from Marc E. Hankin to Anthony Simon (1 page).

Letter of Jun. 25, 2007 from Micah D. Stolowitz to James D. Stevens (2 pages).

Letter of Jun. 20, 2007 from Vernon W. Francissen to Anthony L. Simon (2 pages).

Lin; D., et al. "Data Compression of Voiceband Modem Signals," 40th IEEE Vehicular Technology Conference, May 6-9, 1990, pp. 323-325, Orlando, Florida.

Mueller; Joseph A. "A DSP Implemented Dual 9600/7200 bps TCM Modem for Mobile Communications Over FM Voice Radios," Aug. 20, 1997, IEEE, pp. 758-761.

Speech Coding with Linear Predictive Coding (LPC); www.dspexperts.com/dsp; retrieved Aug. 14, 2005; author unknown; 15 pages.

Phase-Shift Keying; retrieved from Wikipedia at www.wikipedia.org; dated May 5, 2006; 13 pages.

* cited by examiner

*Figure 3*
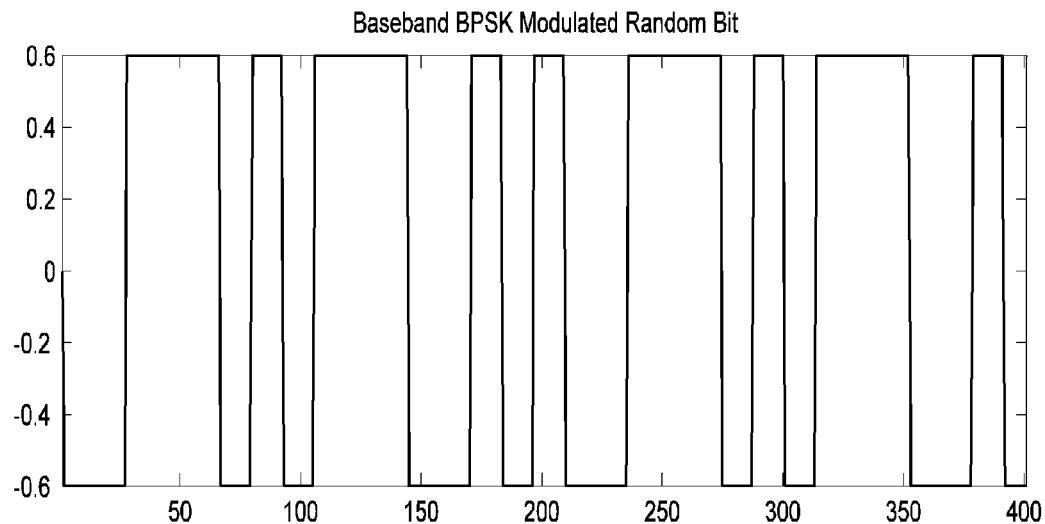
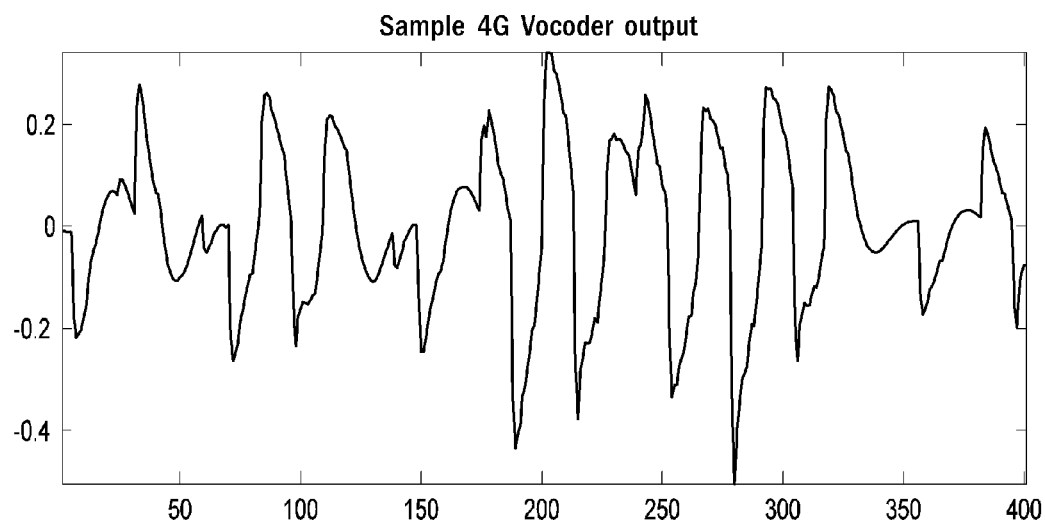
*Figure 4*

DATA COMMUNICATION VIA A VOICE CHANNEL OF A WIRELESS COMMUNICATION NETWORK USING DISCONTINUITIES

CROSS-REFERENCE TO RELATED APPLICATION

This application is a continuation-in-part of U.S. application Ser. No. 11/554,985, filed Oct. 31, 2006, which is a continuation-in-part of U.S. application Ser. No. 11/163,579, filed Oct. 24, 2005. The complete contents of these two pending applications are hereby incorporated by reference.

TECHNICAL FIELD

The present invention relates generally to data communication over a telecommunications network and, more particularly, to data communication over a telecommunications voice channel such as a CDMA or GSM voice traffic channel.

BACKGROUND OF THE INVENTION

Wired telephone systems were originally designed to carry speech to enable voice conversations over long distances. More recently, public switched telephone systems have become a primary medium for transmitting not only voice, but also non-speech data, such as by use of facsimile machines that transmit image information over the telephone lines, or by modems that exchange digital data of various forms (text, binary executable files, image or video files) over these same phone lines.

Today, cellular and other wireless communication systems are in much greater use for purposes of both voice and data communication. Most cellular communication in use in the world today utilize either the GSM (including UMTS) or CDMA (IS-95 or CDMA2000) communication systems. These systems transmit voice data over a voice traffic channel using a modulated carrier wave. For example, 2G GSM uses GMSK modulation and IS-95 CDMA uses PSK modulation. Prior to modulating the voice data for wireless transmission, the voice input is run through a speech compression circuit such as a vocoder to compress the voice input into a smaller amount of data. This reduces the amount of voice data that needs to be transmitted via the wireless network, thereby permitting the use of a smaller bit rate and a greater number of users sharing the same communication system.

Various vocoder techniques have been proposed and used. The most common are various forms of linear predictive codings (LPC); for example, 2G GSM uses a RPE-LPC speech codec, while IS-95 CDMA uses a variable rate CELP codec. These predictive compression techniques are designed specifically for voice encoding and, as such, are designed to filter out noise and other non-speech components. As a result, the transmission of digital data (such as ASCII text, byte codes, binary files) can be problematic since the vocoder processing can corrupt the digital data, making it unrecoverable at the receiving end of the transmission. For example, the recently introduced Qualcomm™ 4G Vocoder is a CDMA2000 device that exhibits a time-varying, non-linear transfer function which, while acceptable for voice encoding, can impose significant distortion when attempting to transmit digital data via the vocoder.

The 4G vocoder uses the 3gpp2 standards-based EVRC-B codec having a full rate of 9.6 kbps. The codec also supports lower bit rates, including a 4.8 kbps half rate and a 1.2 kbps eighth rate. These lower rates are used when the vocoder determines that the full rate is not needed to adequately transmit the sound signals it receives. For example, background noise is typically transmitted at the one-eighth rate. The EVRC-B vocoder uses these different rates to achieve a target rate that can be controlled by the wireless carrier and, as a result, this overall encoding process can make it difficult to successfully send non-speech data through the vocoder.

SUMMARY OF THE INVENTION

The present invention provides a method of data communication using a wireless communication network that allows the transmission of digital data over a voice channel of the communications network. In accordance with one embodiment, the method is used for communicating digital data via a wireless telecommunications network using a voice encoder that operates in different modes according to a classification of incoming data into categories that include at least voiced, unvoiced, and transient speech, wherein each of the different modes is associated with a coding scheme for encoding the incoming data. The method includes the steps of:
  generating a modulated carrier signal by modulating at least one carrier signal with digital data such that the modulated carrier signal includes discontinuities and energy characteristics that cause the voice encoder to classify the modulated carrier signal as transient speech;
  inputting the modulated carrier signal into the voice encoder;
  obtaining an encoded output that is generated by the voice encoder using the inputted modulated carrier signal; and
  transmitting the encoded output across a voice channel of the wireless telecommunications network.

In accordance with another aspect of the invention, there is provided a method of wirelessly transmitting digital data using an EVRC-B vocoder. The method comprises the steps of:
  generating a modulated carrier signal by modulating at least one carrier signal with digital data using a continuous signal modulation technique and inserting discontinuities that create phase changes in the modulated carrier signal without encoding any of the digital data into the phase changes;
  inputting the modulated carrier signal into an EVRC-B vocoder;
  obtaining an encoded output from the vocoder; and
  transmitting the encoded output via an antenna.

BRIEF DESCRIPTION OF THE DRAWINGS

Preferred exemplary embodiments of the invention will hereinafter be described in conjunction with the appended drawings, wherein like designations denote like elements, and wherein:

FIG. 3 a plot of a BPSK baseband as in FIG. 2, but at a bit rate of 12 bits/frame;

FIG. 4 depicts a sample vocoder output using the BPSK waveform of FIG. 3;

DETAILED DESCRIPTION OF THE PREFERRED EMBODIMENTS

Figure 1:
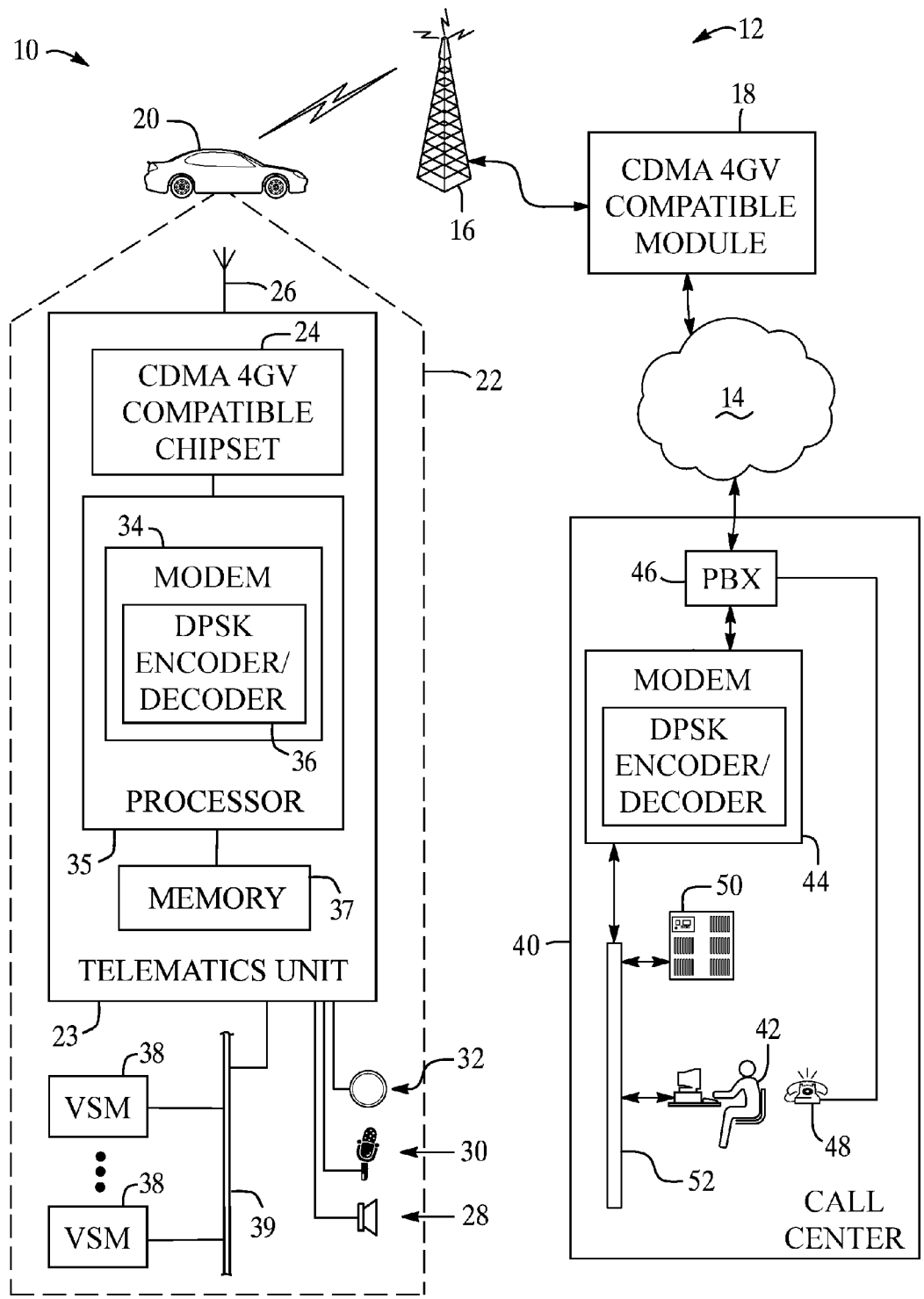
FIG. 1 is a block diagram depicting an electronic communication system constructed in accordance with the invention.

Referring to FIG. 1, there is shown an electronic communication system 10 constructed in accordance with the invention. The communication system 10 includes a conventional cellular communication network having a voice traffic channel that is used for two-way transmission of voice data between cellular telephones. The communication system 10 also includes the ability to utilize the cellular system voice channel to exchange digital data containing information other than speech or other audio. As will be discussed in greater detail below, this data communication is carried out at least in part using differential phase shift keying modulation of one or more audio frequency carrier waves using the digital data. This approach enables data communication via the same voice channel that is used for speech transmission and, with proper selection of carrier frequency and bit rate, permits this data transmission to be accomplished at a bit error rate that is acceptable for most applications.

The communication system 10 includes in general a cellular communication network 12 connected to a land telephony network 14 which together are used to provide voice and data communication between a passenger vehicle 20 and a call center 40. Vehicle 20 has an onboard electronics system, a portion of which is shown at 22. Electronics system 22 has a telematics unit 23 that includes the components normally found in a cellular communication device, such as a CDMA compatible chipset 24 and antenna 26 that enables use of the cellular network 12 to permit a vehicle occupant to carry on voice conversations using a speaker 28 and microphone 30. These components of telematics unit 23 can be implemented in a conventional manner, as will be known to those skilled in the art. Apart from the microphone 30 input, onboard system 22 also includes at least one pushbutton 32 that can be used to initiate a voice communication with a live advisor 42 located at the call center 40.

In accordance with 4G CDMA systems, voice data from both the vehicle occupant (not shown) and the live advisor 42 are encoded using a vocoder to compress the speech prior to wireless transmission over the voice traffic channel via the cell tower 16. Once received over the wireless network, the encoded speech is then decoded by the vocoder for the listener. The vocoder is incorporated into the chipset 24 as well as in a CDMA compatible module 18 located in the base equipment at the cell tower 16. Although various compression codecs can be used, in the illustrated embodiment, the 4G vocoder is implemented as a time-varying, non-linear filter. Various such codecs are well known using linear predictive techniques; for example, a RPE-LPC codec or a fixed or variable rate CELP codec. Any suitable codec (whether linear predictive or not) can be used in the system 10 of FIG. 1.

In addition to the typical voice data transmission over the voice traffic channel, the communication system 10 enables data communication via this same voice traffic channel and through the vocoder 18, 24. This is accomplished using a modem on either side of the vocoder; that is, using a first modem 34 incorporated into the onboard vehicle communication system 22 and a second modem 44 located at the call center 40. These modems can have the same construction and operation so that only modem 34 will be described, and it will be appreciated that the description of modem 34 applies equally to modem 44. As shown in FIG. 1, the telematics unit 23 can switch or multiplex the CDMA 4GV chipset 24 between the modem 34 and the telephony devices 28-32 so that the cellular communication network 12 can be used for either voice or data communication, or both, even during the same call.

Regardless of whether the cellular call is initiated at the vehicle 20 or call center 40, the transmitting modem can use a predefined tone (e.g., 2225 Hz) or series of tones to alert the receiving modem of the requested data transmission, and the various attributes of the data connection can then be negotiated by the two modems. To enable data communication over the voice channel, the modem applies a differential phase shift keying (DPSK) encoding to convert the digital data being transmitted into DPSK data that can be successfully sent via the vocoder 18, 24 and over the voice traffic channel of the cellular network 12. In the different illustrated embodiments, one or more particular forms of DPSK encoding are used; for example, differential binary phase shift keying (DBPSK) modulation. As will be discussed farther below, encoding of the digital data is implemented by modem 34 using one or more carrier signals that are modulated with the data using a DPSK encoder/decoder 36.

As illustrated in FIG. 1, modem 34 and its encoder/decoder 36 can be implemented using software running on the telematics microprocessor 35. This software can be stored in the telematics memory 37. Other alternative implementations will be apparent to those skilled in the art; for example, the modem 34 could be incorporated into the 4GV chipset 24, or can be implemented using a dedicated IC or other hardware component, or the modem software could be stored on processor 35 itself or on other memory not shown.

On the vehicle 20, the digital data being DPSK encoded and sent via modem 34 can be obtained by the telematics unit 23 from one or more vehicle system modules (VSMs) 38 over a vehicle network 39. These modules 38 can be any vehicle system for which information transmission is desired to or from the call center 40 or other remote device or computer system. For example, one VSM 38 can be a diagnostic system that provides diagnostic trouble codes or other diagnostic information to the call center 40. As another example, VSM 38 can be a GPS-enabled navigation system that uploads coordinates or other such information concerning the vehicle's location to the call center. Data can be transmitted from the call center (or other remote device or computer system) to the vehicle as well. For example, where VSM 38 is a navigation system, new maps or other directional or point of interest information can be downloaded to the vehicle. As another example, a VSM 38 can be an infotainment system in which new music or videos can be downloaded and stored for later playback. Furthermore, the term "digital data" as used herein includes not only information, but also executable code such that new programming can be downloaded to the vehicle via the voice traffic channel from a server or other computer. Those skilled in the art will know of other such VSMs 38 and other types of digital data for which communication to and/or from the vehicle 20 is desired.

The vehicle network 39 can be implemented as any suitable network, such as a controller area network (CAN), a media oriented system transfer (MOST), a local interconnection network (LIN), an Ethernet, a local area network (LAN), and can utilize appropriate connections and protocols such as those that conform with known ISO, SAE and IEEE standards and specifications. A separate infotainment network (not shown) can also be included for access by the telematics unit 23 to a vehicle radio system, in which case the speaker 28 could be eliminated and instead the vehicle radio system speaker(s) used for audio output during voice conversations through the communications system 12.

Land network 14 can be a conventional land-based telecommunications network that is connected to one or more landline telephones and connects wireless carrier network 12 to call center 40. For example, land network 14 can include a public switched telephone network (PSTN) and/or an Internet Protocol (IP) network, as is appreciated by those skilled in the art. Of course, one or more segments of land network 14 could be implemented through the use of a standard wired network, a fiber or other optical network, a cable network, power lines, other wireless networks such as wireless local area networks (WLANs) or networks providing broadband wireless access (BWA), or any combination thereof. Furthermore, call center 40 need not be connected via land network 14, but could include wireless telephony equipment so that it can communicate directly with wireless network 12.

Call center 40 includes not only the live advisor 42 and modem 44, but also several other components. It includes a PBX switch 46 to route incoming calls either to one or more telephones 48 for voice communication or to modem 44 for data transmission. The modem 44 itself can be connected to various devices such as a server 50 that provides information services and data storage, as well as a computer used by the live advisor 42. These devices can either be connected to the modem 44 via a network 52 or alternatively, can be connected to a specific computer on which the modem 44 is located. The various components of FIG. 1 include some that are conventional and others that can be implemented based upon the description contained herein and the knowledge possessed by one skilled in the art. For example, although the modems 34, 44 and their DPSK encoder/decoder are not conventional components, techniques for implementing DSPK encoding and decoding are known and can be implemented by those skilled in the art using such components as DSPs and ASICs. Similarly, the other features needed to implement the modems 34, 44 are all well known to those skilled in the art.

Figure 2:
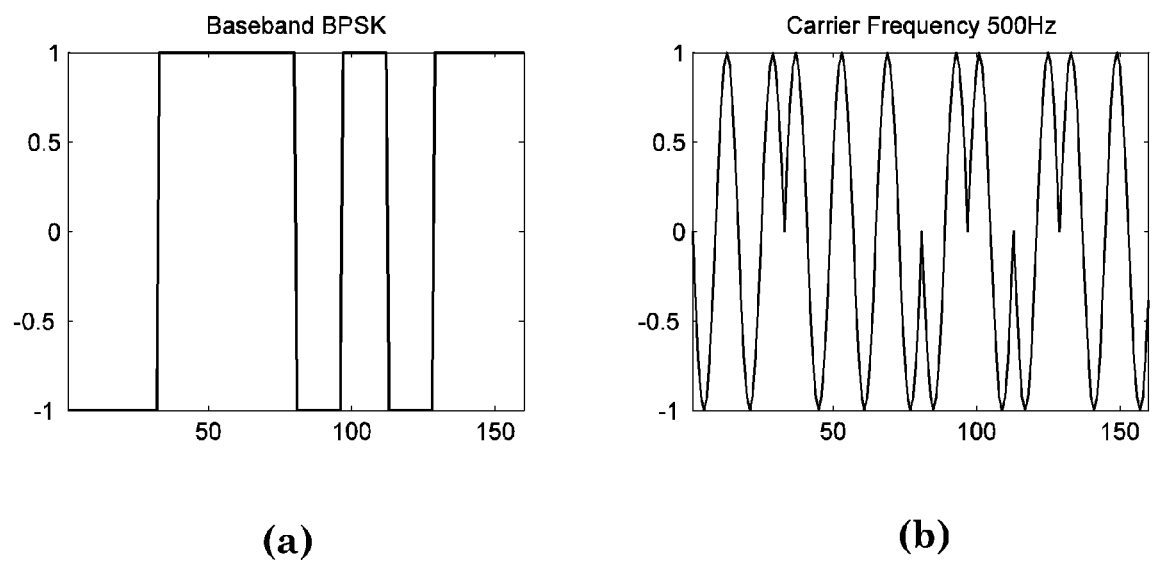
FIG. 2 is a pair of plots showing BPSK encoding of a CDMA data frame at a bit rate of 10 bits/frame.

Turning now to FIGS. 2-8, various phase shift keying (PSK) approaches and results will be described. Because the vocoder used for cellular communication filters out frequencies above that needed for speech transmission, successful data transmission over the cellular voice traffic channel is limited to using frequencies at or below several kilohertz. Thus, where data modulation techniques are to be used, the carrier frequency should be limited to those within this upper frequency. FIG. 2 includes two plots of a random bit pattern used for binary phase shift keying (BPSK) modulation, the first plot (a) being the baseband BPSK representing the random 0011101011 bit pattern, and the second plot (b) being of a 500 Hz carrier frequency modulated with the bit pattern using BPSK. For a sampling rate of 160 samples at an 8 kHz sampling frequency, these ten bits represent a typical 20 ms frame of data, such as is used in CDMA. For comparison, FIG. 3 is a similar BPSK baseband waveform, but at a bit rate of 12 bits/frame, with the waveform depicting two and a half frames of data. This same FIG. 3 waveform is shown in FIG. 4 after it has been sent through the vocoder without first being used to modulate an audio frequency carrier. The filtering carried out by the vocoder makes the digital data unrecoverable from the (FIG. 4) output of the vocoder. Where BPSK modulation of a 500 Hz carrier frequency is used (FIG. 5), the resulting output of the vocoder (FIG. 6) does retain to at least some extent the original data.

Figure 5:
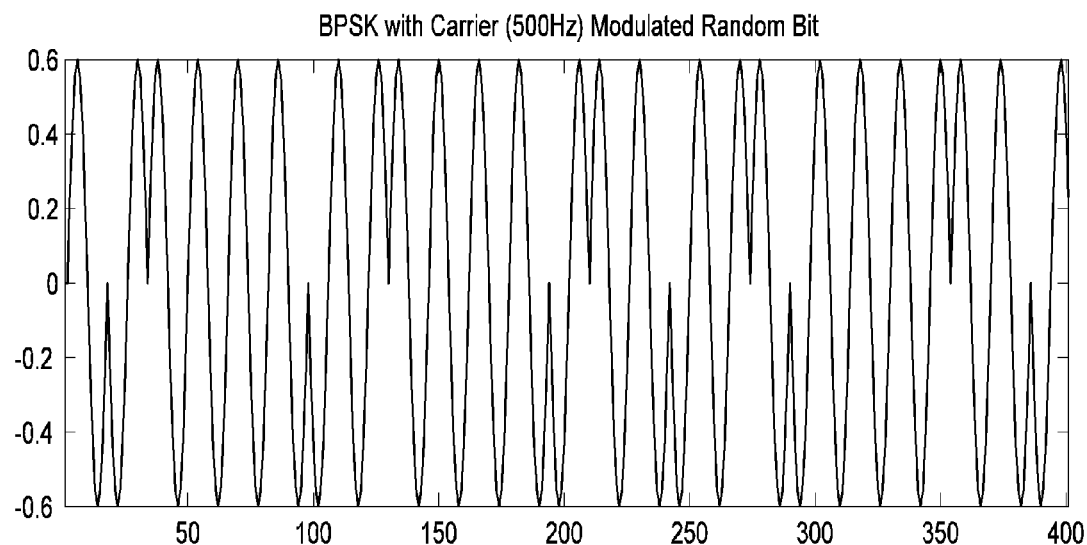
FIG. 5 depicts a 500 Hz carrier modulated by BPSK using a random bit pattern at 10 bits/frame.

Looking at FIG. 5 in greater detail, the modulated 500 Hz waveform of FIG. 5 is at a bit rate of 10 bits/frame using the following random bit pattern:

0100001100001001101111001.

Figure 6:
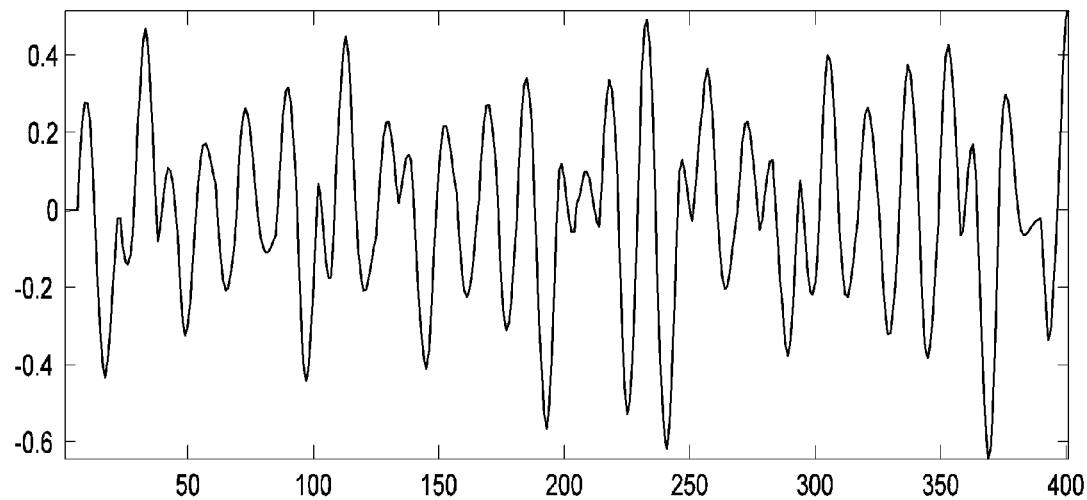
FIG. 6 is a sample vocoder output using the BPSK waveform of FIG. 5.
Figure 7:
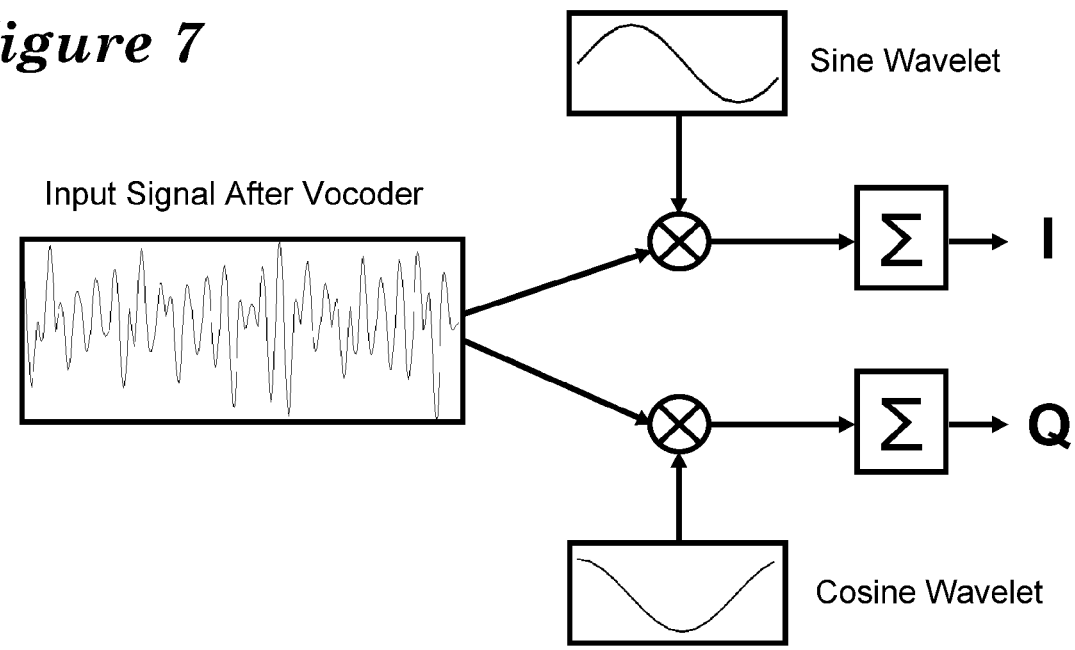
FIG. 7 is a block diagram of a BPSK demodulator.
Figure 8:
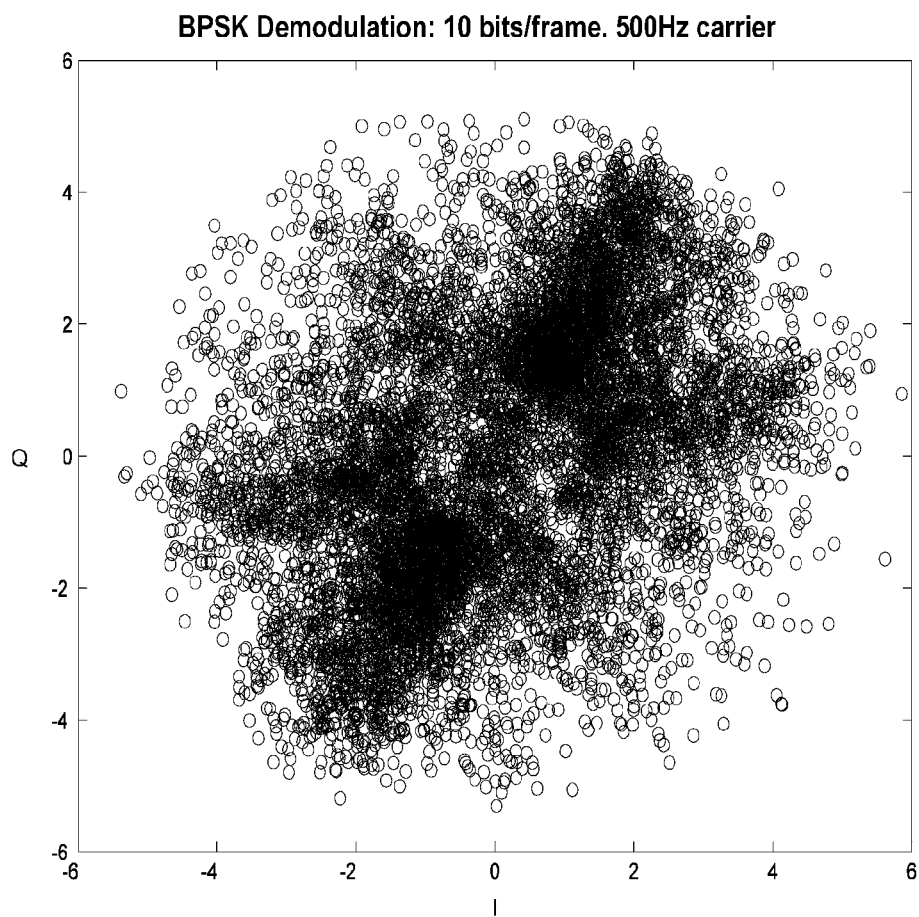
FIG. 8 is a constellation plot of sample BPSK demodulated data.

The resulting vocoder output of FIG. 6 can then be decoded by extracting the phase information to resolve the waveform back into the original digital data. This can be done in a known manner such as is shown in FIG. 7 in which the vocoder waveform is multiplied by a sine waveform and the result summed to get I-axis data points, and is also separately multiplied by a cosine waveform to get Q-axis information. Digital processing techniques for decomposing the vocoder waveform according to FIG. 7 and generating from it the resulting bit pattern is well known to those skilled in the art. A sample constellation plot of sample bit patterns run through the vocoder using BPSK is shown in FIG. 8. As this constellation diagram shows, the use of BPSK through the vocoder does not do well in retaining the original digital data and, as a result, has a bit error rate (BER) that is unacceptably high for most applications. The loss of information using the BPSK appears to be the result of the non-linear, time-varying attributes of the vocoder which can introduce phase drifts in the signal passing through the vocoder.

Apart from the loss of information as a result of this apparent phase drift, successful transmission of the digital data through the vocoder also can be largely dependent on the encoding and transmission rate used by the vocoder. For 4G vocoders such as Qualcomm's® which use an EVRC-B codec that follows the 3GPP2 C.S0014-B ver. 1.0 specification (available at www.3gpp2.org), different rates are used for different types of speech, tones, and background noise. In general, the vocoder encodes and transmits incoming data at a rate that is determined by classifying the inputted signal into categories representative of different types or portions of speech. These categories include voiced, unvoiced, and transient, as well as silence and up- and down-transients. Depending initially upon this classification, but also upon additional tests, the vocoder selects a particular operating mode in which it uses a particular coding scheme and rate to encode and transmit the received data. Generally, this process is carried out on a frame by frame basis, with each frame corresponding to 20 ms of data sampled at 8 kHz. For voice communications, the process is designed to provide a faithful reproduction of speech while accommodating other communication needs (such as ring-back tones) and attempting to minimize bandwidth utilization. However, this process can significantly inhibit data communications over the voice channel because it can result in less than full rate transmission. Without full rate transmission, it can be difficult if not impossible to transmit the digital data through the EVRC-B vocoder at a bit error rate that is acceptable for most applications.

Figure 9:
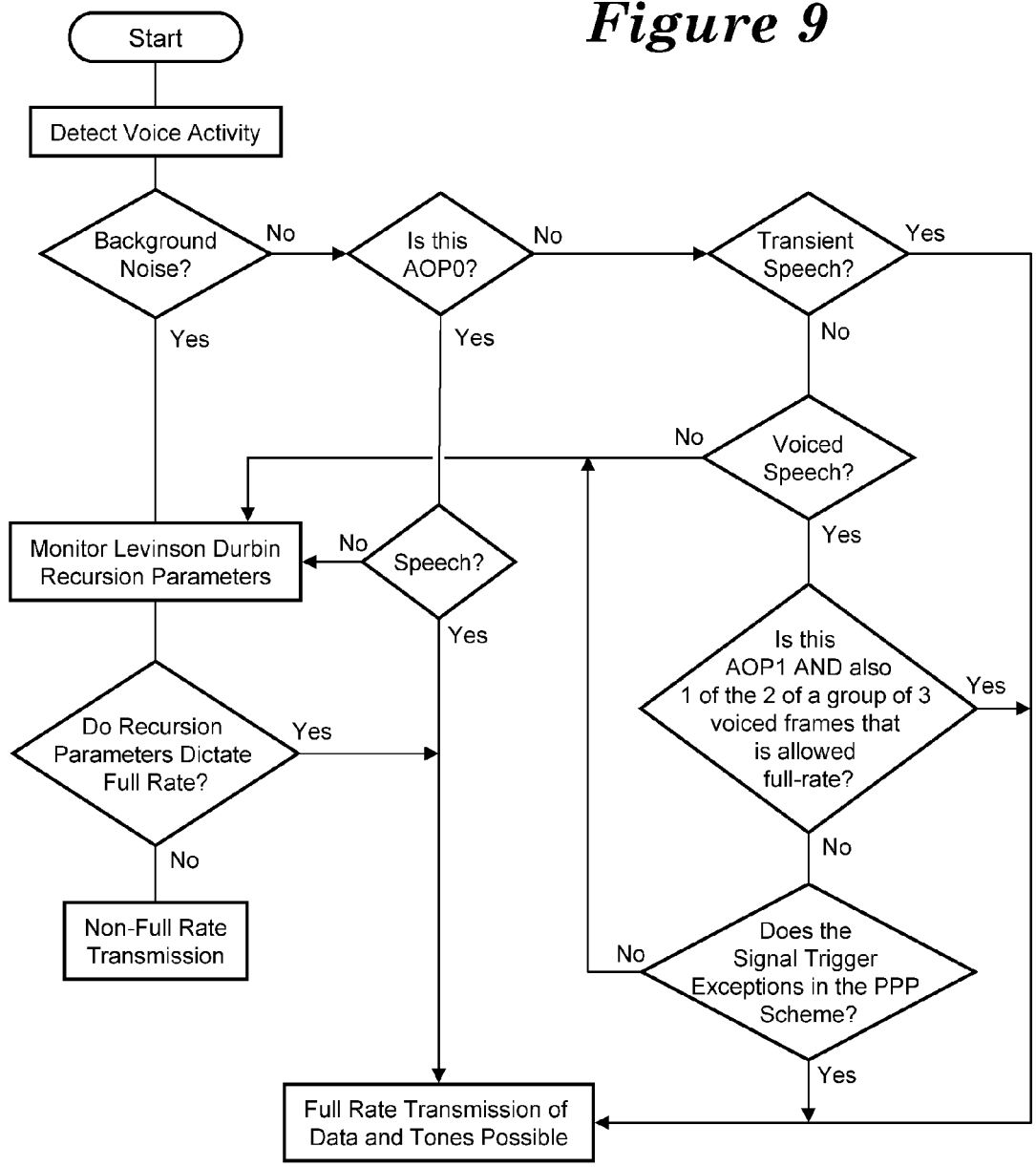
FIG. 9 depicts an overview of the speech classification and rate determination scheme used by EVRC-B vocoders.

For prior generation vocoders that utilize EVRC-A, an incoming signal need only look like speech to get full rate. Thus, modulation techniques such as continuous FSK could be utilized to obtain full rate. For the 4G vocoders, however, the ability to achieve full rate is more difficult. FIG. 9 depicts an analysis of the EVRC-B speech classification scheme contained in the 3GPP2 C.S0014-B ver. 1.0 specification, showing the different tests used to classify the incoming data and which of those tests lead to full rate transmission. EVRC-B uses three main anchor operating points (AOP's): AOP0, AOP1, and AOP2. These operating points are used in determining the rate selection and the anchor operating points themselves are determined based on a target average rate that can be adjusted by the wireless carrier. Thus, a service provider desiring to send digital data through the vocoder typically cannot control the anchor operating point determination. Instead, obtaining the desired full rate can be accomplished by modulating or otherwise conditioning the encoded carrier signal according to one or more of the paths of FIG. 9 that lead to the full rate determination.

In general, the process of FIG. 9 classifies the incoming data as one of a number of categories of speech, such as transient or voiced, and based on that categorization determines if it is to be transmitted at full rate. As a part of the EVRC-B vocoder processing, a Levinson Durbin recursion is applied and, regardless of the classification of the speech as transient or otherwise, the an error parameter of this recursion is monitored to determine if full rate should be assigned. In particular, a Stoporder30 iteration index is calculated and if this value is less than or equal to four, then full rate transmission is used. This allows for ring back tones to be transmitted at full rate. As indicated in FIG. 9, if the incoming data is classified as transient speech, then full rate is assigned. This will be true regardless of whether the vocoder is operating in AOP0 mode (in which case the transient speech will be classified as speech giving full rate), or instead operating in AOP1 or AOP2 mode.

To obtain a categorization of the incoming data as transient speech, it has been found that, by conditioning the incoming data signal such that it has discontinuities and appropriate energy characteristics, the signal will be interpreted by the vocoder as transient speech and thereby assigned full rate. Thus, in view of the characteristics of the coding scheme discussed above in connection with FIGS. 2-8 and the need to obtain full rate, successful transmission of data through the EVRC-B vocoder can be achieved by selection of a modulation scheme that encodes the digital data into one or more carrier signals in a manner that (1) survives the particular linear predictive coding scheme used (e.g., CELP) and (2) imparts discontinuities and energy characteristics to the carrier signal(s) such that the vocoder classifies the inputted signal as transient speech. These discontinuities and energy characteristics will be discussed in greater detail below in connection with particular modulation schemes, a number of which will now be discussed.

Figure 10:
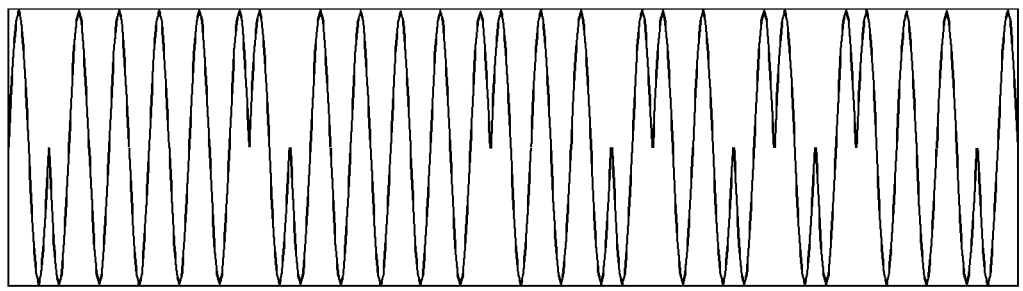
FIG. 10 is a 500 Hz carrier modulated by DBPSK using a random bit pattern at 10 bits/frame.
Figure 11:
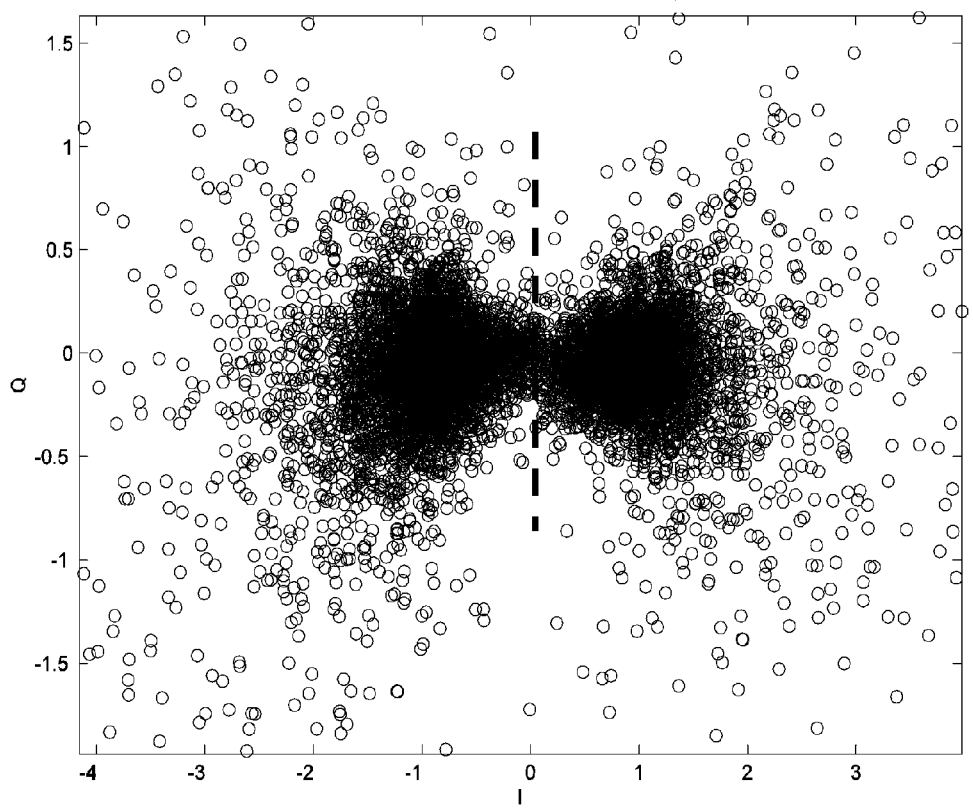
FIG. 11 depicts a constellation plot of the sample DBPSK demodulated data of FIG. 10.

Turning to FIGS. 10 and 11, a first of several modulation techniques using differential phase shift keying (DPSK) will now be discussed. The use of DPSK avoids the phase problems introduced by the vocoder. The DPSK modulates the carrier in accordance with the difference between successive information bits in the bit pattern and, in doing so, eliminates the problems caused by random phase drifts. Preferably, differential binary phase shift keying (DBPSK) is used, an example of which is shown in FIGS. 10 and 11. In FIG. 10, the same bit pattern from FIG. 5 is again used, but this time is used to modulate the 500 Hz carrier using DBPSK. FIG. 11 shows the constellation diagram for the decomposed vocoder output after it has been subjected to DBPSK decoding. As this plot shows, the results of demodulation are highly differentiated along the I-axis with the zeros and ones of the bit pattern centralized around two nodes on either side of the Q-axis line extending through the origin. Thus, the original digital data can be recovered with a relatively low bit error rate. Sample data using DBPSK such as is shown in FIG. 10 was tested using a Qualcomm® 4G vocoder running in different operating modes. The bit error rate of the sample data using a carrier frequency of 500 Hz and 500 bits/sec (10 bits/frame) was about 1.5%. Other combinations of frequencies and bit rates (bits/frame) can be used as long the resulting bit error rate is acceptable for the particular application involved. For example, using DBPSK at 500 bits/sec, good results have been obtained at carrier frequencies of 500 Hz, 800 Hz, 850 Hz, 900 Hz, 950 Hz, 1000 Hz, 1300 Hz, 1350 Hz, and 1850 Hz, and that these carrier frequencies can be varied up and down about 50 Hz without significant degradation of the bit error rate. This gives preferred frequency ranges of 450-550 Hz, 750-1050 Hz, 1250-1400 Hz, and 1800-1900 Hz. For two-way communication over the voice channel, different frequencies are preferably used in each direction with enough frequency separation between them; for example, 500 Hz and 950 Hz.

As indicated in FIG. 10, the use of DPSK results in phase shifts that provide discontinuities in the modulated carrier signal which are one of the features identified above as being helpful in having the signal categorized by the vocoder as transient speech. The benefit of discontinuities in the modulated carrier signal inputted into the vocoder is that it gives the signal low periodicity which is one of the factors used by EVRC-B vocoders in categorizing the incoming signal. Periodicity of the input signal is determined by the vocoder using a calculated normalized autocorrelation function (NACF) of the second subframe, which is referred to herein as $NACF_{sf2}$ and can be computed using the equation for it given in the 3GPP2 C.S0014-B ver. 1.0 specification. Where $NACF_{sf2}$ is below a threshold value associated with unvoiced speech, the periodicity of the signal is considered low and this is one indicator used by the vocoder that the signal should be classified as transient speech. The unvoiced threshold value, referred to as UNVOICEDTH, is determined by the vocoder based on a signal to noise ratio. The phase shift discontinuities resulting from the DPSK modulation achieve this low value for $NACF_{sf2}$.

Another feature of the incoming signal analyzed by the vocoder in determining speech classification (voiced, unvoiced, transient, etc.) is the energy characteristics. Two of these are bER (band energy ratio) and vER2 which is a calculated value based on the ratio of the current frame energy to a three frame average voice energy. bER is a measure of the ratio of energy contained in a lower frequency band of 0-2 kHz to the energy contained in a higher frequency band of 2-4 kHz. It is computed using the equation:

$$bER = \log_2 \frac{EL}{EH}$$

where EL is the amount of energy contained in the 0-2 kHz frequency band and EH is the amount of energy contained in the 2-4 kHz frequency band. To meet the requirements for transient speech, most of the energy must be located in the lower frequency band such that bER>0. Equations and techniques for determining EL and EH for each frame of the inputted signal are known to those skilled in the art.

For vER2, transient speech requires that the calculated value must exceed a fixed threshold of −15, with vER2 being determined according to the equation:

$$vER2 = \text{MIN}\left(20, 10*\log_{10}\frac{E}{vEav}\right)$$

where E is the energy of the current frame, and vEav is the average energy over three previous voiced frames. Although a goal of the modulation techniques disclosed herein is to avoid any frames being categorized as voiced by the vocoder, a typical telephony connection over the cellular communication system 12 will involve not just data transmission, but actual speech as well (e.g., between the vehicle occupant and call center personnel 42) so that there will typically be voiced frames in which the vEav can be determined and, even if not, the vocoder uses a default value of 0.1 for vEav where there are frames classified as unvoiced or inactive speech.

When all three of the foregoing tests are met (that is, $NACF_{sf2}$<UNVOICEDTH, bER>0, and vER2>−15) by the signal inputted to the vocoder, the signal is classified as transient by the vocoder and given full rate. Through experimentation it has been determined that, for certain bit rates and carrier frequencies, the DPSK modulation technique conditions the carrier signal such that it has the discontinuities and energy characteristics that cause the vocoder to assign it full rate. The bit rates and carrier frequencies noted above for DBPSK have been found to work for the Qualcomm® 4G vocoder. However, different vocoder designs (which often use different speech compression codecs) may require the use of a different carrier frequency or different combination of carrier frequency and bit rate to achieve an acceptable bit error rate. For any particular vocoder design, the appropriate frequency and bit rate can be determined by testing the vocoder using sample waveforms. In general, any carrier frequency of 4,000 Hz or less (down to about 1 Hz) is preferably used, and more preferably the carrier frequency is within the range of 400 Hz to 2,500 Hz. Apart from the carrier frequency, the bite rate can be selected not just to achieve a low bit error rate, but also as necessary or desired for a particular application. Preferably, the digital data has a bit rate of 250 to 3,000 bits/sec. When selecting a particular carrier frequency and bit rate, the modulated carrier should be examined at any of the possible operational modes of the vocoder to insure that the bit error rate is acceptable for the intended application.

Figure 12:
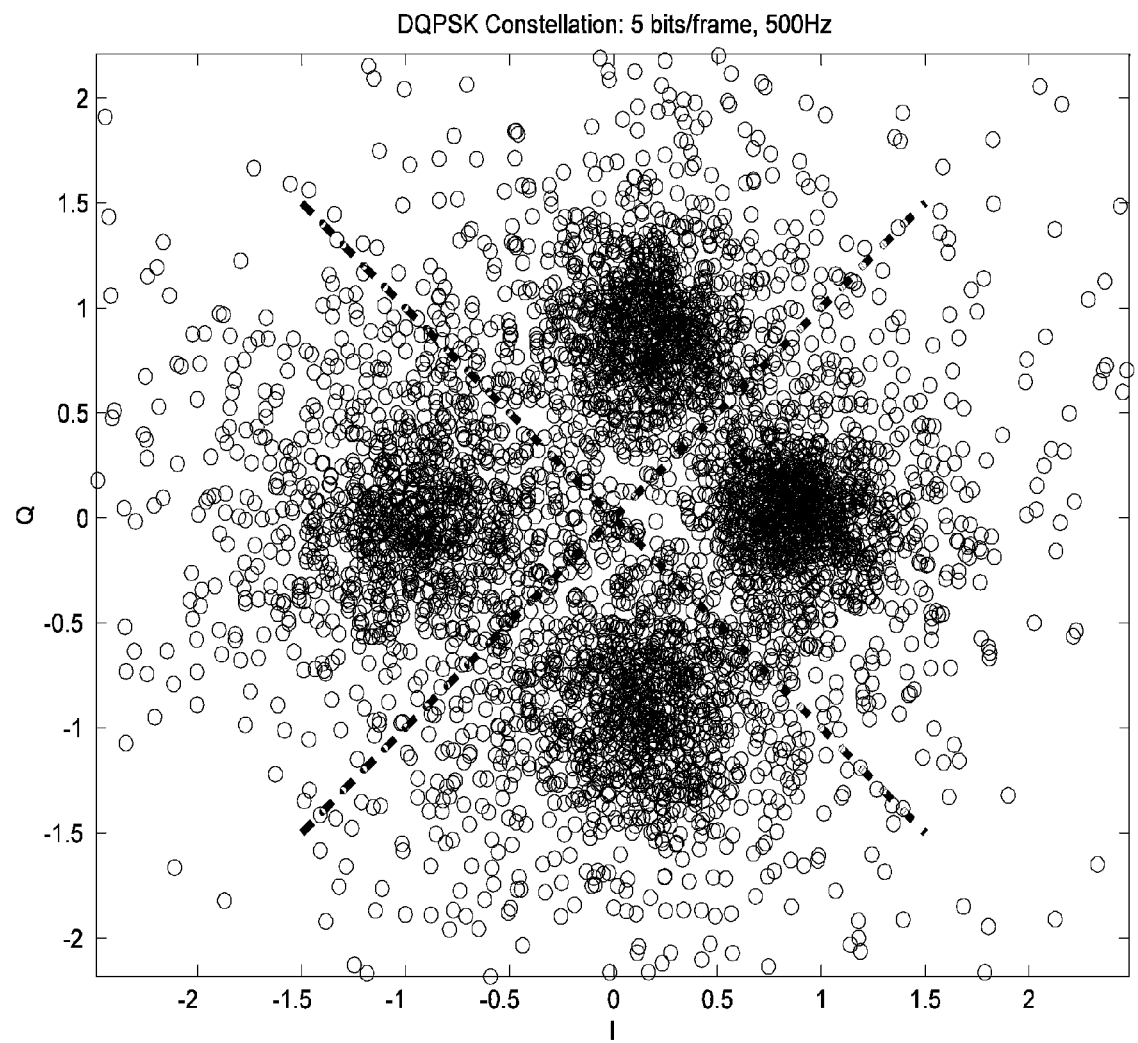
FIG. 12 depicts a constellation plot of sample DQPSK demodulated data.

Apart from DBPSK, other forms of differential phase shift keying modulation can be used as long as they result in a suitable bit error rate for the particular vocoder involved. For example, FIG. 12 depicts a constellation plot for differential quadrature phase shift keying (DQPSK) using 5 bits/frame and a 500 Hz carrier. As can be seen from this plot, there is a higher bit error rate. Testing of the Qualcomm® 4G vocoder noted above at the same 500 Hz, 10 bits/frame input that was used for the DBPSK testing showed a bit error rate of about 6% at all three operating modes of the vocoder. Although this quadrature approach has demonstrated a higher bit error rate than DBPSK, it can nonetheless be used in applications where the higher bit error rate can be tolerated. At 1000 bits/sec, DQPSK can be run at frequencies of 900 Hz, 950 Hz, and 1350 Hz, again with a 50 Hz variation up or down in frequency to give preferred frequency ranges of 850-1000 Hz and 1300-1400 Hz.

Figure 13:
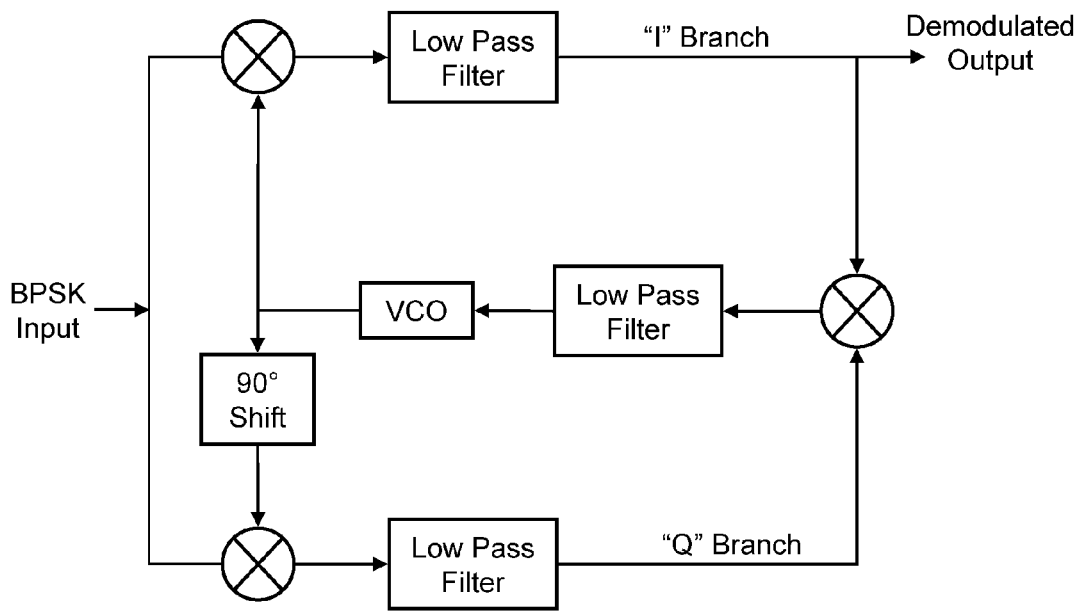
FIG. 13 is a block diagram of a BPSK demodulator that uses a Costas loop for phase tracking.

Referring back to the BPSK examples of FIGS. 2(b) and 5, and comparing these modulated signals with the DBPSK example of FIG. 10, it can be seen that the modulated BPSK carriers include discontinuities and energy characteristics similar to that of the DBPSK modulation of FIG. 10. Thus, the problem with successful transmission of the BPSK modulated carrier is not that it cannot achieve transient speech status and obtain full rate, but that as discussed above, there is a loss of information believed to occur because of phase drifts of the signal. Thus, where it is desired to use PSK (binary or otherwise) and not DPSK, a phase tracker or PLL such as the Costas loop shown in FIG. 13 can be used in demodulating the received carrier signal so that the phase drift does not prevent recovery of the encoded data. This Costas loop can be implemented as a part of the DPSK encoder/decoder 36 used in the modems 34, 44 of FIG. 1, and can be implemented in software. The programming and use of the Costas loop is known to those skilled in the art.

Figure 15:
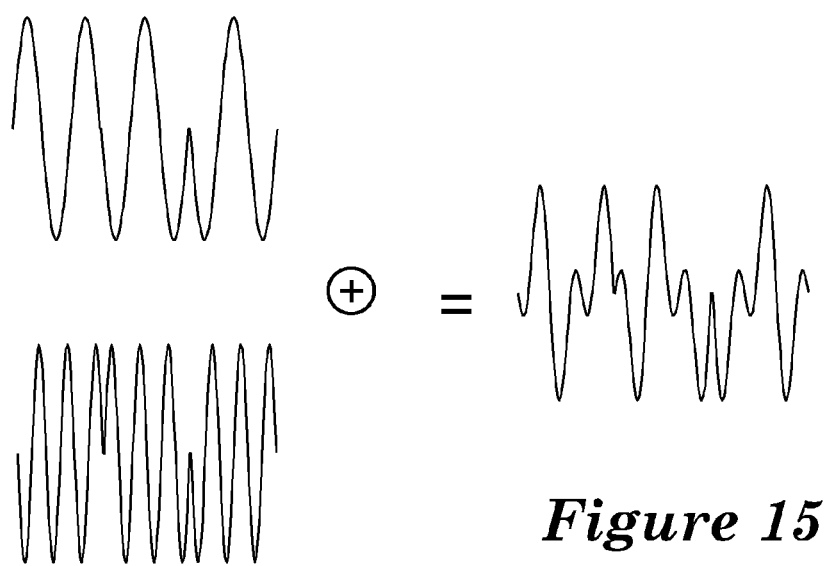
FIG. 15 depicts two DBPSK modulated carrier signals at different frequencies and the resulting composite modulated carrier signal obtained by using the process of FIG. 14.
Figure 14:
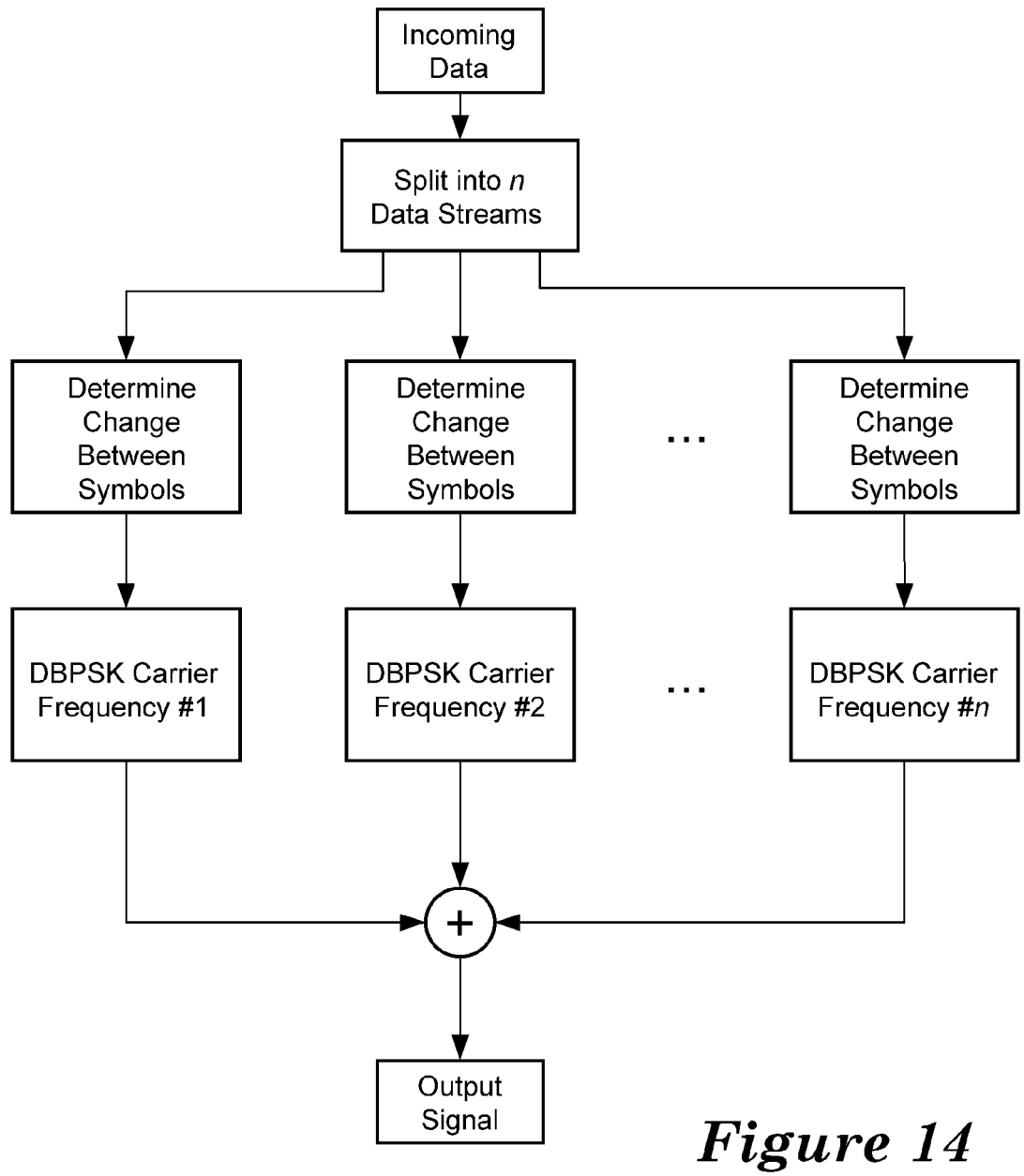
FIG. 14 is a flow chart of a multi-DPSK modulation scheme.

Turning now to FIG. 14, there is shown a second type of DPSK modulation that can be used to transmit digital data through an EVRC-B vocoder and over a voice channel of the cellular communications system 12. In this embodiment, DBPSK is used as in the modulation scheme discussed above in connection with FIGS. 10 and 11, except that it is done by splitting the digital data into a desired number n of different streams with DBPSK being used on each stream to encode a different frequency carrier signal based on the change between the symbols (i.e., 0 to 1 or 1 to 0) in the digital data. The modulated carrier signals are then summed together to form a composite modulated carrier signal. When separating the incoming digital data into the different streams, different portions of the data are used for each stream so that, for example, where only two streams (two carrier frequencies) are used, alternating groups of the digital data (e.g., 10 bytes at a time) are used to modulate carrier signal #1 and the remaining alternating groups of digital data are used to modulate carrier signal #2. The size of each group can be selected as desired or appropriate for a particular application, whether it be done in larger groups or only as a single bit so that each successive bit is modulated at a different frequency than its predecessor. The size of the groups need not be the same so that, for example, larger groups of data could be encoded at a higher frequency while smaller groups of data could be encoded at a lower frequency. FIG. 15 depicts an example of two individual modulated carrier signals, each at a different frequency, and shows the resulting composite modulated carrier signal after they are summed together.

Demodulation of the DBPSK data streams can be performed jointly. The data streams can be separated out by distinguishing between the different carrier frequencies. Once separated by frequency, the correct differential phase can then be determined for each of the known carrier frequencies, and the digital data can then be recovered through standard DBPSK demodulation techniques.

With an appropriate selection of bit rate and carrier frequencies, the resulting composite carrier signal will have the discontinuities and energy characteristics necessary to obtain full rate transmission as transient speech through the EVRC-B vocoder. Although this modulation approach can be used with whatever bit rates and carrier frequencies are determined to provide an acceptably low bit error rate, in general, it is preferably used with bit rates from 250-3,000 bits/sec and frequencies from as low as about 1 Hz up to 4,000 Hz and, more preferably, from 400 Hz to 2,500 Hz. Highly preferred frequencies for use with two carrier signal modulation (i.e., n=2) at 1,000 bits/sec rate are 650 and 1150 Hz, and 900 and 1400 Hz (or within ±50 Hz of these). One frequency pair can be used in one direction over the voice channel and the other can be used in the other direction.

Figure 16:
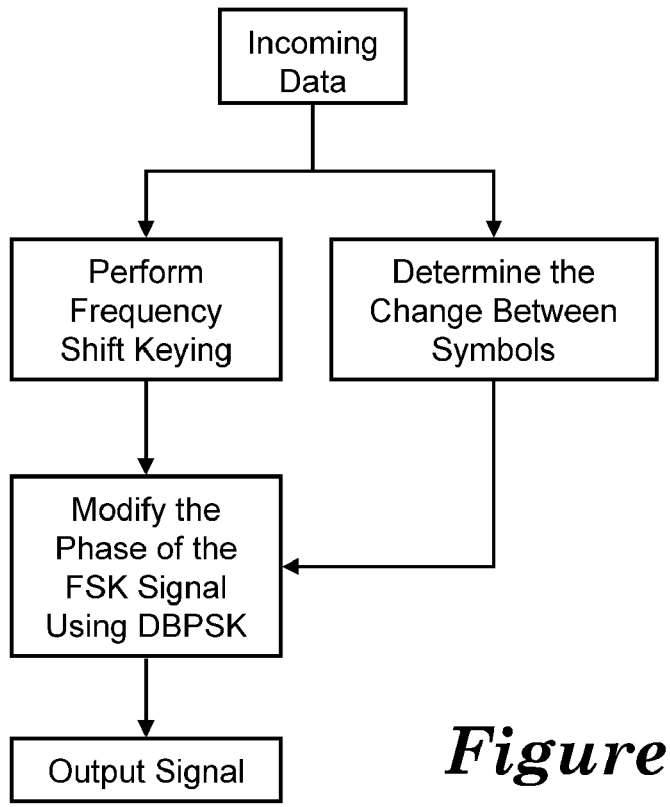
FIG. 16 is a flow chart of a combined FSK-DBPSK modulation technique.

With reference now to FIG. 16, a further DPSK embodiment is disclosed in which frequency shift keying (FSK) is used in conjunction with DPSK (preferably, DBPSK) to encode the digital data. In this embodiment, the digital data is used to carry out FSK of a carrier signal, switching between two different frequencies in accordance with the digital data. That same data is also used to perform DBPSK of the FSK modulated carrier signal. Thus, both frequency and phase of the carrier signal is modulated and the data is represented both by the particular tone that is sent (the FSK portion) as well as by the particular phase shift at the beginning of the tone (the DBPSK portion). Demodulation can be performed jointly and, once the frequency of a particular symbol is known, the correct differential phase can then be determined. As a result of this scheme, the demodulated data will produce 2 bits per symbol of inputted digital data, rather than the 1 bit of the modulation schemes discussed above. Although DBPSK is preferably used, DQPSK and other forms of DPSK can be selected if suitable for a particular application. As with the other DPSK modulation techniques discussed above, the phase shifts in the modulated carrier signal resulting from the use of DPSK, along with proper frequency and possibly bit rate selection, give the modulated carrier signal the necessary discontinuities and energy characteristics to cause the EVRC-B vocoder to classify the signal as transient speech and assign it full rate. The general frequency and bit rate ranges specified above for the other DPSK techniques can be used for this FSK-DPSK modulation scheme. In a more highly preferred embodiment, at 1000 bits/sec the following frequency pairs can be used (again at frequencies within ±50 Hz of those given): 850 and 1400 Hz, 850 and 1450 Hz, 900 and 1350 Hz, 900 and 1550 Hz, 950 and 1550 Hz, 1000 and 1550 Hz, 1100 and 1800 Hz, 1150 and 1550 Hz, 1150 and 1750 Hz, 1400 and 2050 Hz, 1450 and 2000 Hz, 1500 and 2000 Hz, and 1500 and 2050 Hz.

Figure 17:
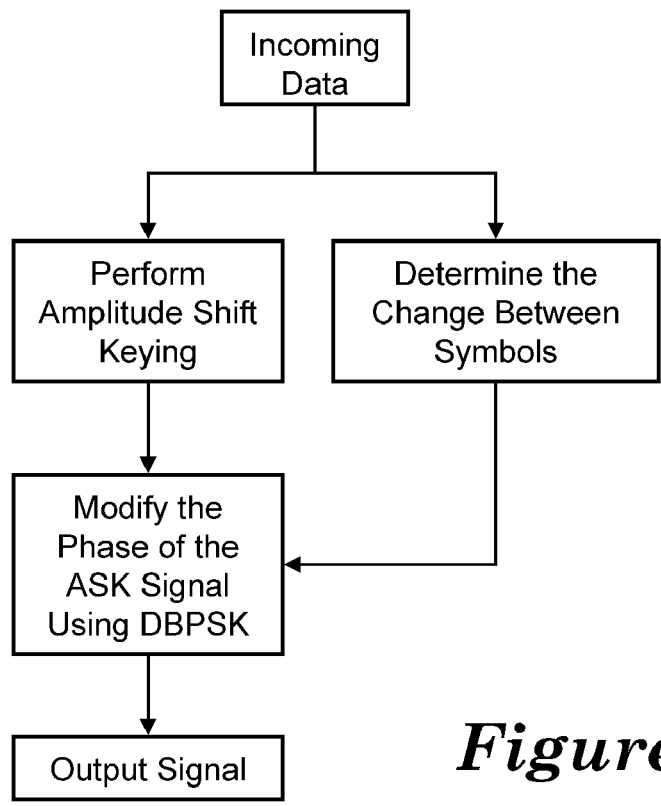
FIG. 17 is a flow chart of a combined ASK-DBPSK modulation technique.

A similar approach to this FSK-DPSK technique is shown in FIG. 17, except that amplitude shift keying (ASK) is used in lieu of FSK. The general frequency and bit rate ranges specified above for the other DPSK techniques can be used for this ASK-DPSK modulation scheme. Thus, the bit rate can be from 250-3,000 bits/sec and the frequencies from as low as about 1 Hz up to 4,000 Hz and, more preferably, from 400 Hz to 2,500 Hz. By applying the DPSK modulation to the ASK modulated carrier signal, and by proper selection of bit rate and frequency, the resulting modulated carrier signal can have the discontinuities (and, thus, low periodicity) and energy characteristics necessary to obtain full rate transmission as transient speech through the vocoder.

As discussed above in connection with FIG. 13, for any of these previous modulation techniques (e.g., multi-DPSK, FSK-DPSK, and ASK-DPSK), discontinuities in the carrier signal can be achieved using regular PSK rather than DPSK with a Costas loop or other suitable phase tracker used to avoid the loss of information due to phase drifts.

Apart from using some form of phase shift keying to obtain discontinuities in the modulated carrier signal, other approaches to inserting discontinuities can be used in order to obtain a transient speech classification when the signal is sent through the vocoder. For example, continuous ASK and/or FSK modulation can be used to encode the data onto at least one carrier signal and the discontinuities can be inserted into the modulated carrier signal. In this approach, rather than encoding some or all of the digital data into the inserted discontinuities, as was done with the prior disclosed embodiments, the inserted discontinuities instead create phase changes without encoding any of the digital data into those phase changes. The insertion of discontinuities should be carried out such that the signal will have sufficient discontinuities and energy characteristics to cause an EVRC-B vocoder to classify the modulated carrier signal as transient speech, such that the modulated carrier signal will be transmitted at full rate by the vocoder.

Figure 18:
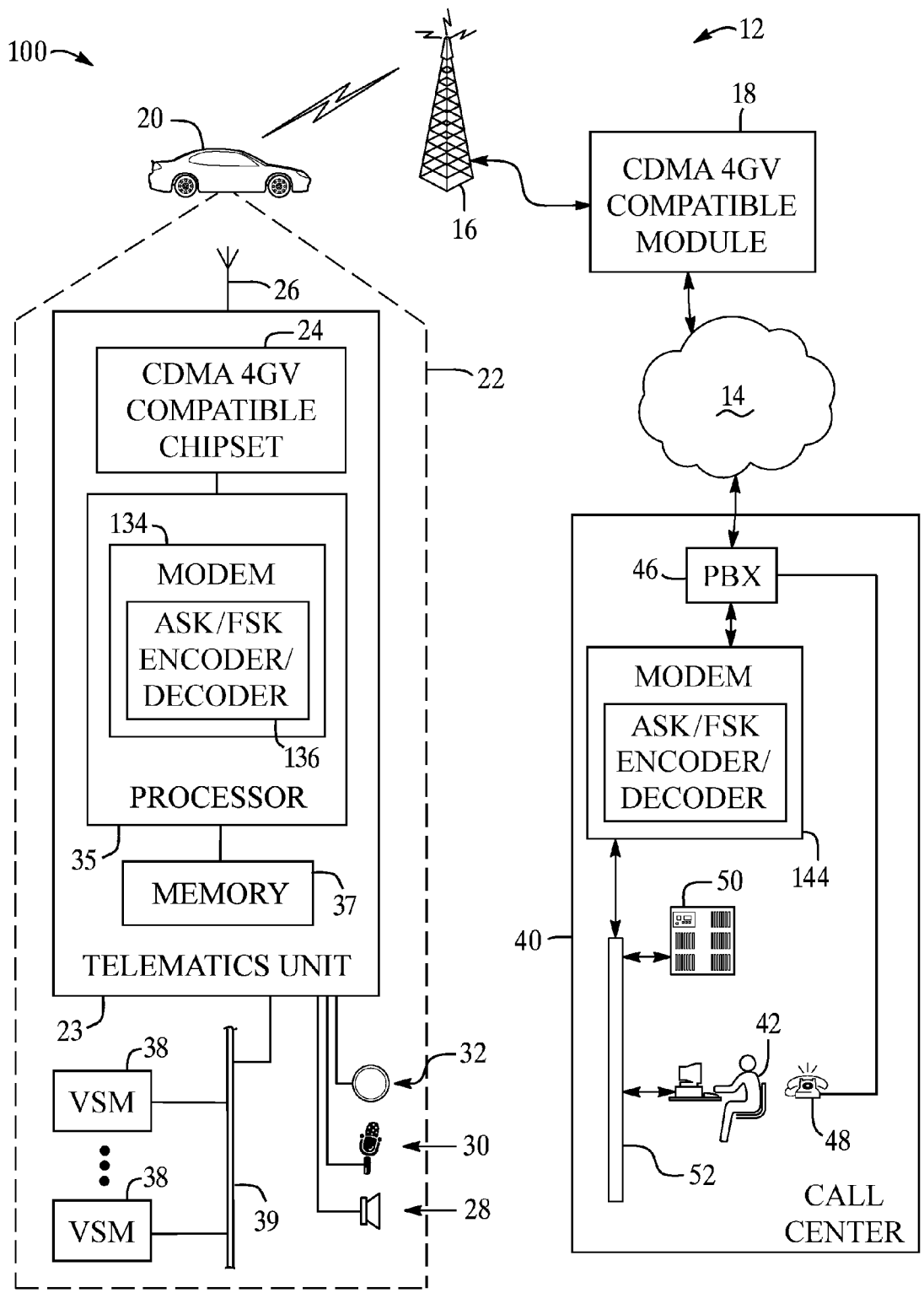
FIG. 18 is a block diagram as in FIG. 1 depicting an alternative electronic communication system constructed in accordance with the invention.

FIG. 18 is a block diagram as in FIG. 1 depicting an alternative communication system 100 in which all of the components can be the same as for FIG. 1 except that the modems 134 and 144 do not use differential phase shift keying (DPSK) of the digital data. Instead, digital data can be encoded into carrier signal using ASK and/or FSK using techniques known to those skilled in the art. That is, rather than using DPSK (either by itself or in conjunction with the FSK or ASK shown in FIGS. 14-17), continuous ASK and/or FSK is used along with inserted discontinuities to obtain a modulated carrier signal having discontinuities and energy characteristics sufficient to cause the EVRC-B vocoder (in the CDMA 4GV modules 18 and 24) to classify the modulated carrier signal as transient speech and therefore assign full rate. The insertion of discontinuities can be done as the one or more carrier signals are being modulated with the digital data (i.e., concurrently with the modulation) or after modulation is carried out, and the determination of one or more particular techniques for inserting the discontinuities is within the level of skill in the art. The insertion of these discontinuities should be done in a manner that does not significantly affect the modulation scheme's performance, and this can be determined through testing. In this regard, where the modems 134, 144 are implemented in software, the modulation and insertion of discontinuities can be achieved by suitable programming, as will be known to those skilled in the art.

Figure 19:
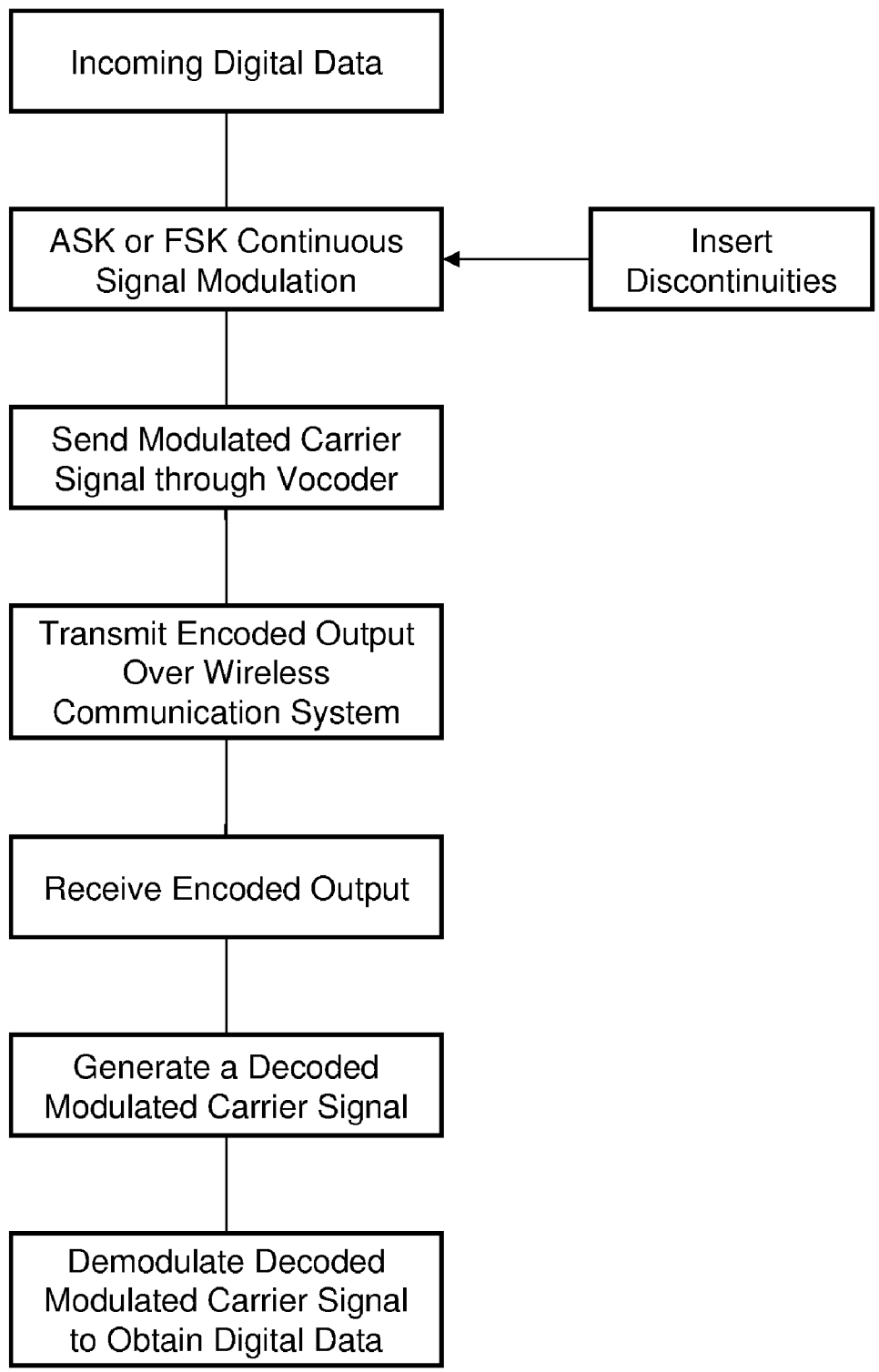
FIG. 19 is a flow chart of a continuous modulation technique using inserted discontinuities.

FIG. 19 depicts one method of data transmission over the voice channel of a wireless communication system using continuous ASK or FSK along with inserted discontinuities. In this method, the incoming data is used to generate a modulated carrier signal by modulating at least one carrier signal with the incoming data using a continuous signal modulation scheme such as ASK or FSK. The modulation is accompanied by the insertion of discontinuities that are independent of the digital data. This results in a modulated carrier signal in which ASK or FSK modulation encodes the digital data and the inserted discontinuities cause the voice encoder to classify the modulated carrier signal as transient speech. Again, the insertion of discontinuities can be done during modulation, as shown in FIG. 19, or subsequently. The particular characteristics of the inserted discontinuities (e.g., their average rate, periodicity or randomness, phase relationship, etc.) can be selected as desired or necessary for a particular application (e.g., dependent upon the particular vocoder used), and the selection and implementation of these characteristics will be known or determinable by those skilled in the art. As discussed above, the goal of the use of the discontinuities is to cause the vocoder to classify the modulated carrier signal as transient speech, which for an EVRC-B vocoder involves meeting the various energy characteristics represented by the equations given above.

Apart from this step of generating the modulated carrier signal, the remainder of the method can proceed in the same manner as for the other techniques discussed above for generating the modulated carrier signal. That is, the modulated carrier signal is then inputted into the voice encoder, an encoded output is obtained from the voice encoder, that encoded output is transmitted across a voice channel of the wireless telecommunications network, received, and used to generated a decoded modulated carrier signal that is then demodulated to obtain the original digital data.

With reference back to FIG. 18, in an example where data is being transmitted from the vehicle 20 to the call center 40 using the method of FIG. 19, the step of generating the modulated carrier signal can be carried out by the modem 134 using digital data received from one of the vehicle system modules 38. The steps of processing this modulated carrier signal for transmission over the voice channel can be accomplished by first using the CDMA 4GV chipset 24 to encode the modulated carrier signal from the modem 134, and this can be done using a linear predictive codec of the type that exhibits a time-varying, non-liner transfer function that at least partially filters out non-speech components of the inputted data. The encoded output can then be transmitted over the cellular network 12 via the vehicle antenna 26. Then, receiving of the encoded output in this example then involves receiving the modulated carrier signal at the call center 40 after it has been through a voice decoder within the CDMA 4GV module 18. Finally, at the call center 40 the modulated carrier signal is then demodulated back into the digital data originally supplied by the VSM 38.

It will be appreciated by those skilled in the art that the method of FIG. 19 is but one embodiment of a broader method contemplated herein for transmitting digital data via a voice channel. In this broader method, a modulated carrier signal is generated by modulating at least one carrier signal with the digital data such that the modulated carrier signal has discontinuities and energy characteristics that cause the voice encoder to classify the modulated carrier signal as transient speech. The generating of this modulated carrier signal can be carried out using any of the DPSK (or PSK with phase tracking) or hybrid DPSK-FSK or DPSK-ASK techniques discussed above or, alternatively, using the FIG. 19 approach in which a continuous modulation technique is used with discontinuities being inserted that create phase changes in the signal, but that do not contain any of the digital data.

It is to be understood that the foregoing description is of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example" and "such as," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. A method of communicating digital data via a wireless telecommunications network using a voice encoder that operates in different modes according to a classification of incoming data into categories that include at least voiced, unvoiced, and transient speech, wherein each of the different modes is associated with a coding scheme for encoding the incoming data, the method comprising the steps of:
   generating a modulated carrier signal by modulating at least one carrier signal with digital data such that the modulated carrier signal includes discontinuities and energy characteristics that cause the voice encoder to classify the modulated carrier signal as transient speech;
   inputting the modulated carrier signal into the voice encoder;
   obtaining an encoded output that is generated by the voice encoder using the inputted modulated carrier signal; and
   transmitting the encoded output across a voice channel of the wireless telecommunications network.

2. The method of claim 1, wherein the generating step further comprises modulating the at least one carrier signal using frequency shift keying or amplitude shift keying modulation and inserting discontinuities into the at least one carrier signal.

3. The method of claim 2, wherein the step of inserting discontinuities further comprises applying phase shift keying modulation using the digital data, whereby the inserted discontinuities comprise phase information containing at least some of the digital data.

4. The method of claim 2, wherein the step of inserting discontinuities further comprises inserting discontinuities that are independent of the digital data, whereby the modulation of the at least one carrier signal using amplitude shift keying or frequency shift keying modulation encodes the digital data into the modulated carrier signal and the inserted discontinuities cause the voice encoder to classify the modulated carrier signal as transient speech.

5. The method of claim 1, wherein the generating step further comprises modulating the at least one carrier signal with the digital data using differential phase shift keying modulation.

6. The method of claim 5, wherein the step of modulating using differential phase shift keying modulation further comprises modulating a single frequency carrier signal at a selected bit rate with the digital data using differential binary phase shift keying modulation.

7. The method of claim 1, further comprising the steps of:
   receiving the encoded output transmitted via the wireless telecommunications network;
   generated a decoded modulated carrier signal by decoding the received encoded output using a voice decoder; and
   demodulating the decoded modulated carrier signal.

8. The method of claim 1, wherein the generating step further comprises generating the modulated carrier signal as a composite modulated carrier signal by carrying out the steps of:
   modulating a plurality of carrier signals, each carrier signal having a different frequency and being modulated with a portion of the digital data using differential phase shift keying modulation; and
   combining the plurality of modulated carrier signals into a composite modulated carrier signal.

9. The method of claim 1, wherein the generating step further comprises generating the modulated carrier signal as a composite modulated carrier signal by carrying out the steps of:
   modulating a first carrier signal having a first frequency with a portion of the digital data using differential binary phase shift keying modulation;
   modulating a second carrier signal having a second frequency with the remainder of the digital data using differential binary phase shift keying modulation; and combining the two modulated carrier signals into a composite modulated carrier signal.

10. A method of wirelessly transmitting digital data using an EVRC-B vocoder, the method comprising the steps of:
generating a modulated carrier signal by modulating at least one carrier signal with digital data using a continuous signal modulation technique and inserting discontinuities that create phase changes in the modulated carrier signal without encoding any of the digital data into the phase changes;
inputting the modulated carrier signal into an EVRC-B vocoder;
obtaining an encoded output from the vocoder; and
transmitting the encoded output via an antenna.

11. The method of claim 10, wherein the generating step further comprises generating the modulated carrier signal such that it has the following characteristics:
a) $NACF_{sf2} < UNVOICEDTH$;
b) $bER > 0$; and
c) $vER2 > -15$;
where:
$NACF_{sf2}$ is a second subframe normalized autocorrelation function and UNVOICEDTH is a threshold value based on a determined signal to noise ratio;
bER is a frequency band energy ratio determined according to the equation $$bER = \log_2 \frac{EL}{EH},$$

with EL being the amount of energy contained in a lower frequency band of 0-2 kHz, and EH being the amount of energy contained in a higher frequency band of 2-4 kHz; and
vER2 is determined according to the equation $$vER2 = \mathrm{MIN}\left(20,\ 10 * \log_{10} \frac{E}{vEav}\right),$$

with E being the energy of a current frame of the modulated carrier signal and vEav being the average energy over three previous voiced frames of the modulated carrier signal.

* * * * *